(12) United States Patent
Yang et al.

(10) Patent No.: US 10,923,436 B2
(45) Date of Patent: Feb. 16, 2021

(54) TECHNIQUES FOR THERMAL MATCHING OF INTEGRATED CIRCUITS

(71) Applicant: QUALCOMM Incorporated, San Diego, CA (US)

(72) Inventors: Bin Yang, San Diego, CA (US); Kai Liu, San Diego, CA (US); Xia Li, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/362,951

(22) Filed: Mar. 25, 2019

(65) Prior Publication Data

US 2020/0312786 A1 Oct. 1, 2020

(51) Int. Cl.
*H01L 23/00* (2006.01)
*H01L 25/16* (2006.01)
*H01L 23/498* (2006.01)
*H04W 88/02* (2009.01)
*H04W 88/08* (2009.01)

(52) U.S. Cl.
CPC ...... *H01L 23/562* (2013.01); *H01L 23/49816* (2013.01); *H01L 23/49822* (2013.01); *H01L 23/49894* (2013.01); *H01L 25/16* (2013.01); *H04W 88/02* (2013.01); *H04W 88/08* (2013.01)

(58) Field of Classification Search
CPC combination set(s) only.
See application file for complete search history.

(56) References Cited

U.S. PATENT DOCUMENTS

2011/0303945 A1* 12/2011 Zitzlsperger ...... H01L 23/49586
257/99
2015/0334849 A1* 11/2015 Tsubota ............... B23K 1/0016
228/220

\* cited by examiner

*Primary Examiner* — Ratisha Mehta
(74) *Attorney, Agent, or Firm* — Patterson & Sheridan, L.L.P.

(57) ABSTRACT

Certain aspects of the present disclosure provide apparatus for thermal matching of integrated circuits (ICs). One example apparatus generally includes a first substrate, a first IC disposed on the first substrate and having a second substrate, and a second IC disposed on the first substrate. The second IC may include a third substrate, a thermal conductivity adjustment region comprising different material than the third substrate, the thermal conductivity adjustment region being adjacent to a first side of the third substrate, and one or more electrical components formed in one or more layers of the second IC adjacent to a second side of the third substrate, wherein the first side and the second side are opposite sides of the third substrate, and wherein a thermal conductivity of the thermal conductivity adjustment region is closer to a thermal conductivity of the second substrate than a thermal conductivity of the third substrate.

16 Claims, 11 Drawing Sheets

TECHNIQUES FOR THERMAL MATCHING OF INTEGRATED CIRCUITS

FIELD OF THE DISCLOSURE

The present disclosure generally relates to an electrical module, and more particularly, to techniques for thermal matching of integrated circuits of the electrical module.

DESCRIPTION OF RELATED ART

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. For example, mobile electronic devices now commonly include multiple integrated circuits (ICs) disposed on a single substrate of an electronic module, allowing mobile device users to execute complex and power intensive software applications on their mobile devices.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure provide apparatus and techniques for thermal matching of integrated circuits (ICs) of a module.

Certain aspects provide an electrical module. The electrical module generally includes a first substrate, a first IC disposed above the first substrate and having a second substrate, and a second IC disposed above the first substrate. The second IC may include a third substrate, a thermal conductivity adjustment region comprising different material than the third substrate, the thermal conductivity adjustment region being adjacent to a first side of the third substrate, and one or more electrical components formed in one or more layers of the second IC adjacent to a second side of the third substrate, wherein the first side and the second side are opposite sides of the third substrate. In certain aspects, a thermal conductivity of the thermal conductivity adjustment region is closer to a thermal conductivity of the second substrate of the first IC than a thermal conductivity of the third substrate.

Certain aspects provide an electrical module. The electrical module generally includes a first substrate, a first IC disposed above the first substrate and having a second substrate, and a second IC disposed above the first substrate. The second IC may include a third substrate, a thermal conductivity adjustment region comprising different material than the third substrate, the thermal conductivity adjustment region being adjacent to a first side of the third substrate, and one or more electrical components formed in one or more layers of the second IC adjacent to a second side of the third substrate, wherein the first side and the second side are opposite sides of the third substrate. In certain aspects, a first wavelength in which the thermal conductivity adjustment region absorbs infrared (IR) energy overlaps with a second wavelength in which the second substrate absorbs IR energy, and the first wavelength is non-overlapping with a third wavelength in which the third substrate absorbs IR energy.

Certain aspects provide a method for fabricating an electrical module. The method generally includes forming a first IC having a first substrate, disposing the first IC above a module substrate of the electrical module, and forming a second IC. In certain aspects, forming the second IC includes forming a second substrate, forming one or more electrical components in one or more layers of the second IC adjacent to a first side of the second substrate, and forming a thermal conductivity adjustment region comprising different material than the second substrate, the thermal conductivity adjustment region being adjacent to a second side of the second substrate, the first and second sides being opposite sides of the second substrate. In certain aspects, a thermal conductivity of the thermal conductivity adjustment region is closer to a thermal conductivity of the first substrate of the first IC than a thermal conductivity of the second substrate. The method may also include disposing the second IC above the module substrate of the electrical module.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
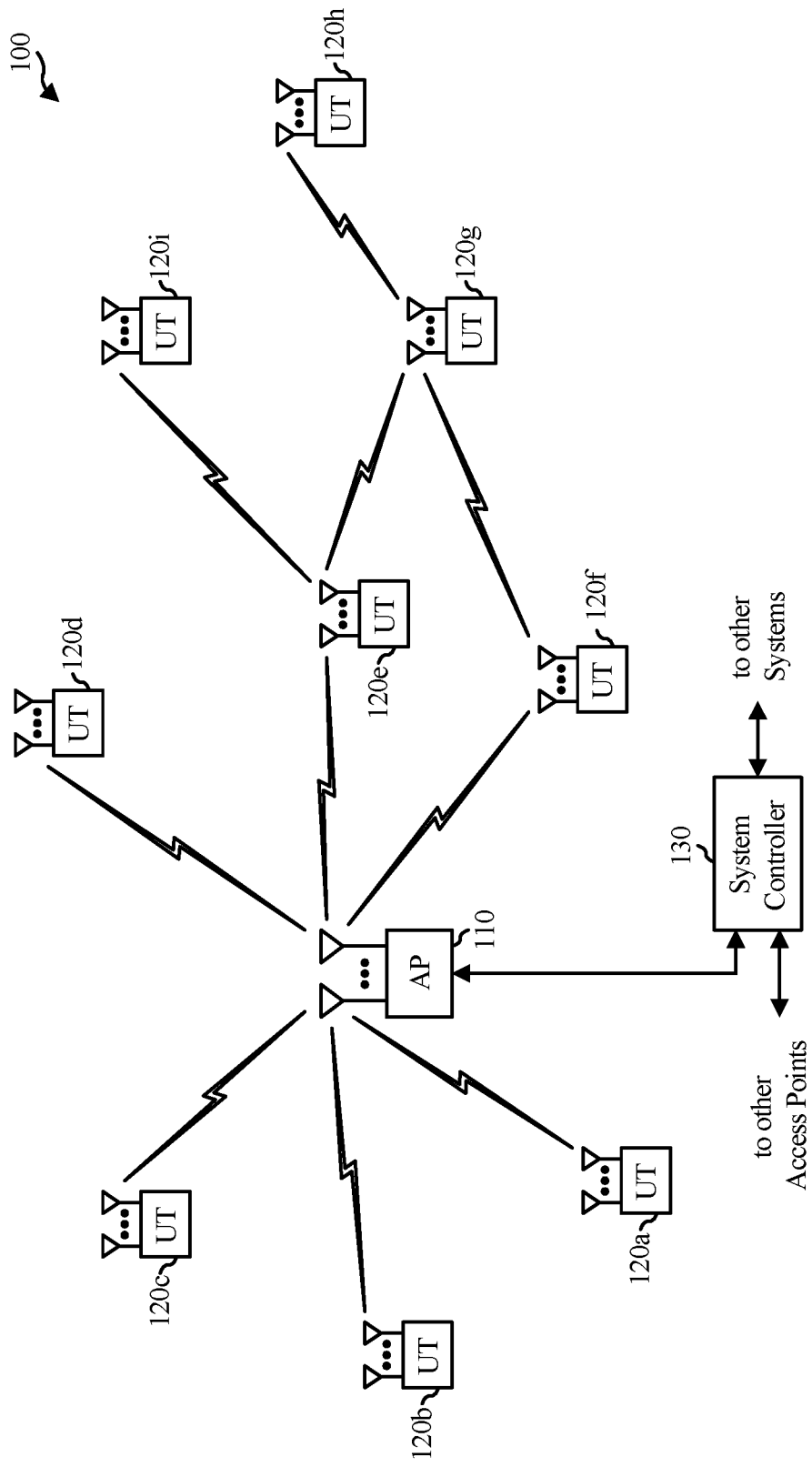
FIG. 1 illustrates a wireless communications system with access points and user terminals, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more integrated circuits (ICs) implemented on a module using a thermal matching technique, as described in more detail herein.

Figure 2:
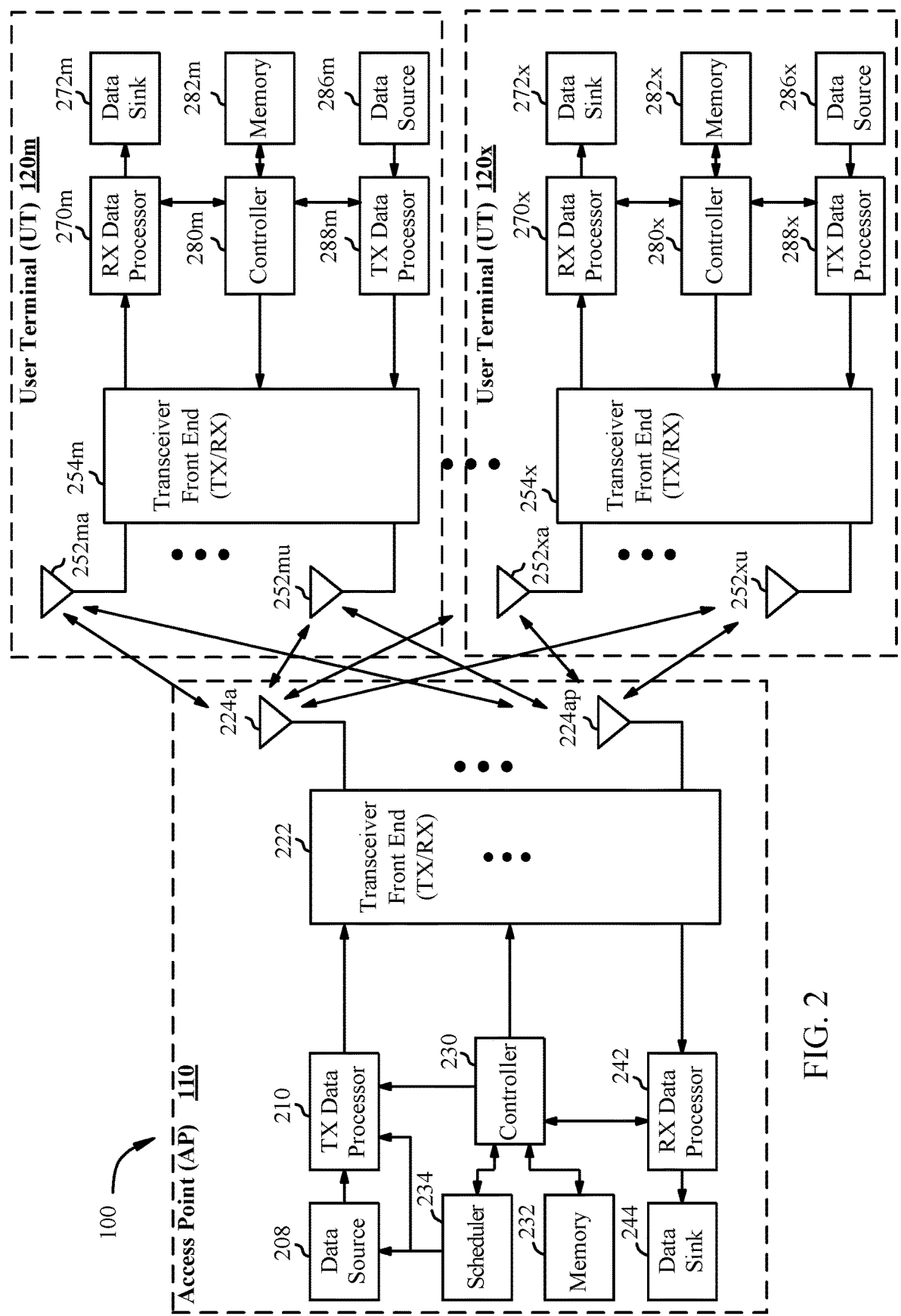
FIG. 2 is a block diagram illustrating an access point and two user terminals of a wireless system, in which aspects of the present disclosure may be practiced.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include one or more ICs implemented on a module using a thermal matching technique, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
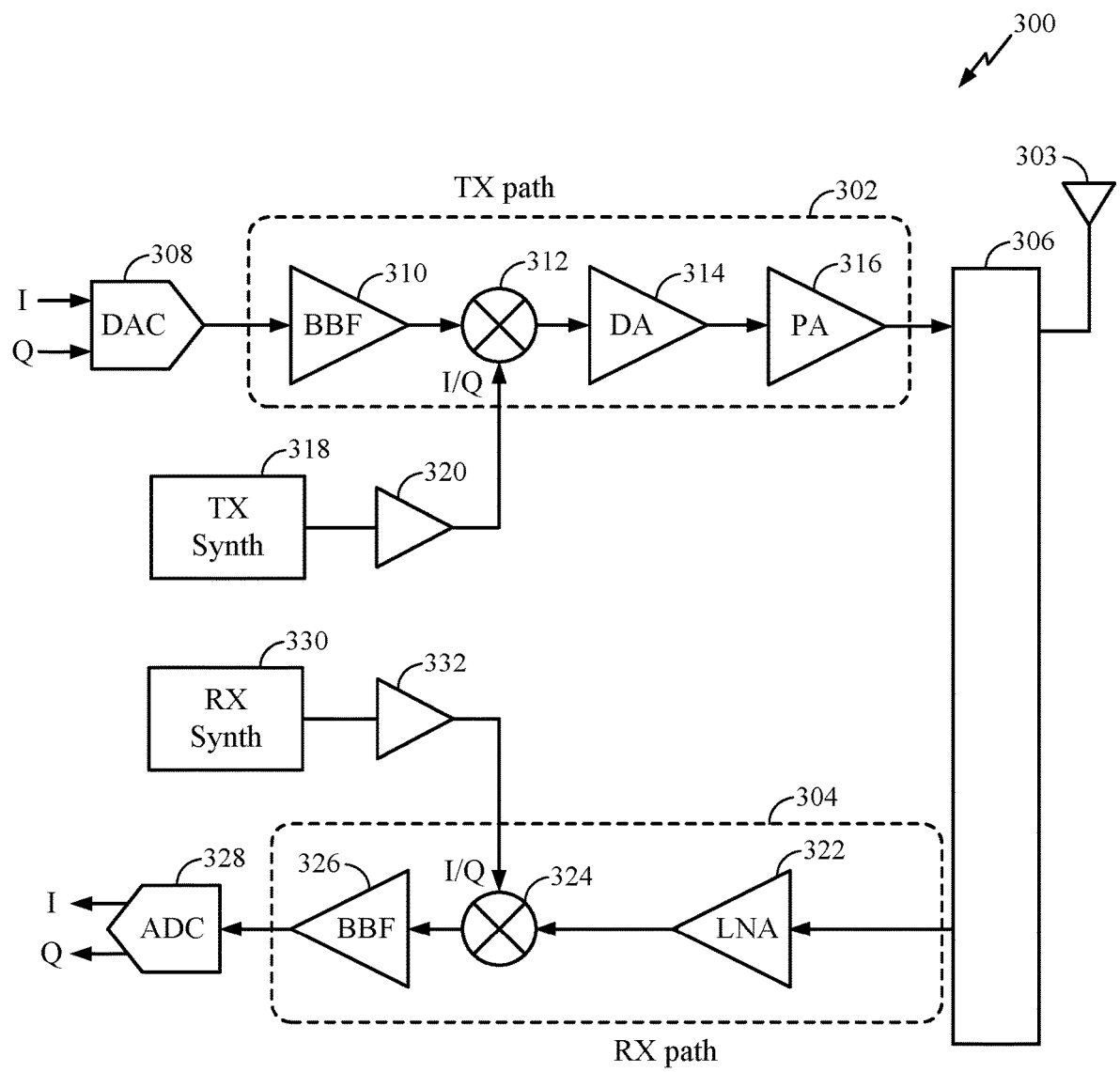
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. In certain aspects, multiple components described with respect to FIG. 3 may be in separate ICs and implemented on the same module using thermal matching techniques, as described in more detail herein.

Figure 4:
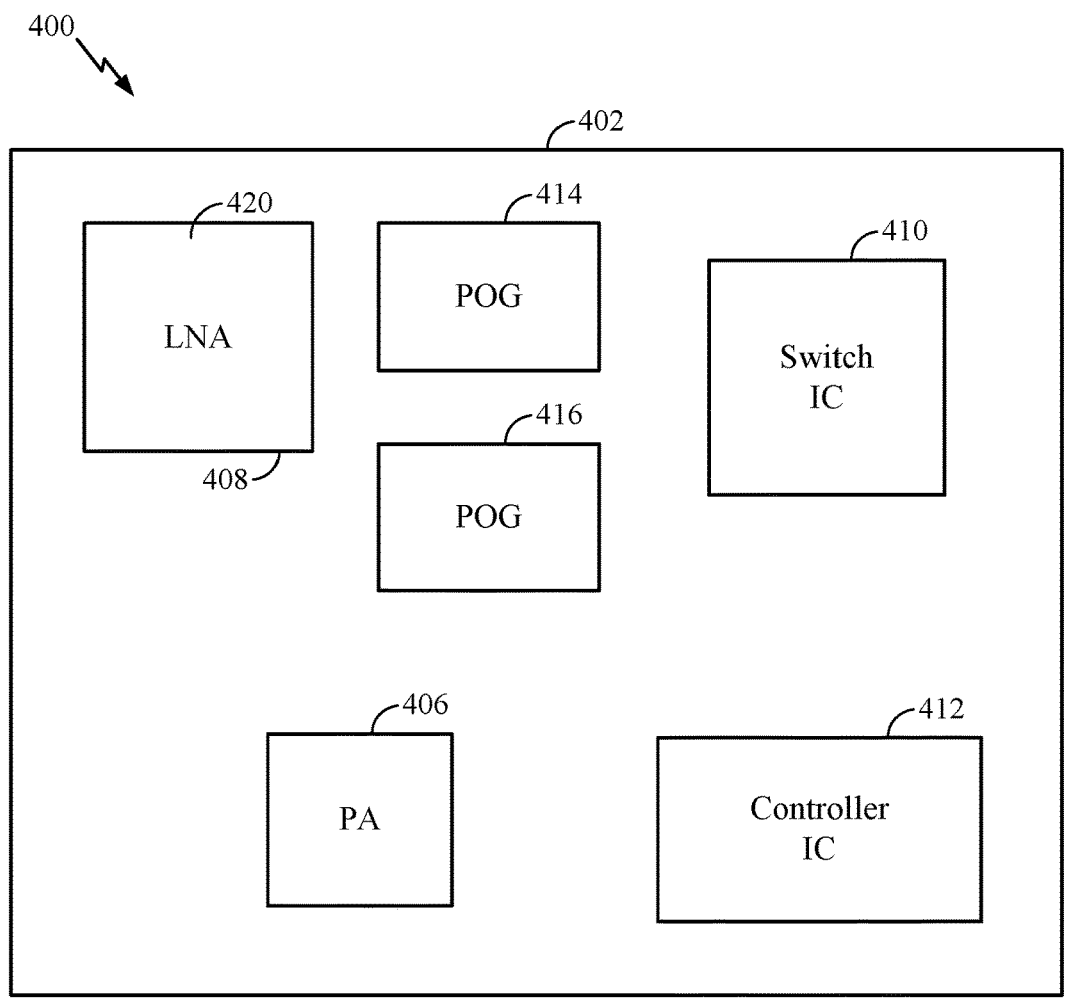
FIG. 4 is a block diagram of an example module including multiple ICs implemented on a substrate, in accordance with certain aspects of the present disclosure.

FIG. 4 is a module 400 including multiple ICs (also referred to as "DIEs") implemented on a substrate 402, in accordance with certain aspects of the present disclosure. As illustrated, the module 400 may include multiple ICs. For example, the module 400 may include a PA IC 406 (e.g., corresponding to PA 316), an LNA IC 408 (e.g., corresponding to LNA 322), a switch IC 410 (e.g., switches in interface 306), and a controller IC 412 (e.g., to control the states of the switches in the switch IC 410). The PA IC 406, LNA IC 408, switch IC 410, and controller IC 412 may be implemented using ICs with silicon (Si) or gallium arsenide (GaAs) substrates, for example. For example, a substrate 420 may be on top of the semiconductor DIE of the LNA IC 408. In certain aspects, the substrate 420 may be implemented using Si or GaAs.

The module 400 may also include one or more passive devices. The passive devices may be implemented using a passive-on-glass (POG) device, such as the POG devices 414, 416 (e.g., POG ICs). The passive device may include one or more passive components. For example, the passive device may include at least one capacitor, such as a metal-insulator-metal (MIM) capacitor, at least one inductor, or both. The capacitor(s) may be coupled to the inductor(s), such that combination(s) of these passive components are configured to operate as a radio frequency (RF) resonator and/or a filter. The passive devices of the POG device may be fabricated on a glass substrate, as described in more detail herein.

Attaching ICs to a substrate (e.g., substrate 402) involves a fast DIE temperature ramp and high peak temperature. The ICs of the module 400 may be soldered during the same solder reflow process using a single heating source. Therefore, different heating absorption rates of the ICs may be problematic since the amount of applied heat may be sufficient for one IC, but may be insufficient for another IC.

Glass may have a much lower heat absorption rate as compared to Si or GaAs. For example, Si and GaAs may absorb infrared (IR) energy in certain wavelengths more efficiently as compared to glass, resulting in a DIE temperature ramp that is faster with a higher peak temperature as compared to glass. For example, Si and GaAs may efficiently absorb IR energy at wavelengths above 1 micrometer, whereas certain glass materials may efficiently absorb IR energy at wavelengths below 1 micrometer. Thus, soldering of the POG devices implemented using glass substrates on the same substrate 402 as the ICs (e.g., PA IC 406) implemented using Si and/or GaAs substrates may be problematic due to their different heat absorption rates. For instance, increasing the heat source temperature for successfully soldering the POG devices may result in the overheating of Si and GaAs ICs, potentially causing damage and decreasing the module yield.

While FIGS. 1-4 provide a wireless communication system as an example application in which certain aspects of the present disclosure may be implemented to facilitate understanding, certain aspects described herein may be used for thermal matching in any of various other suitable systems (e.g., any electronic system).

Example Thermal Matching Techniques

Figure 5:
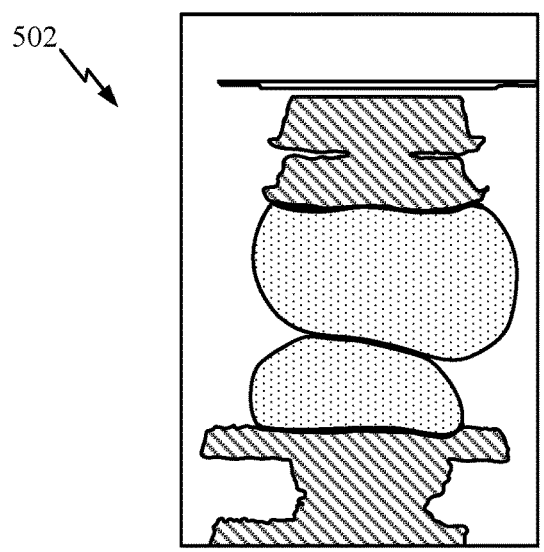
FIG. 5 illustrates non-wetting of a solder bump after a solder reflow process, in accordance with certain aspects of the present disclosure.

FIG. 5 illustrates a solder bump 502 after a solder reflow process, in accordance with certain aspects of the present disclosure. For example, when insufficient heat is applied to the solder bumps of an IC, solder bump non-wetting may occur during the solder reflow process, as illustrated by solder bump 502. The non-wetted solder bump 502 may result in inadequate electric connectivity, resulting in manufacturing test failures and reduced yields, or even worst, resulting in latent failures causing customer dissatisfaction.

Certain aspects of the present disclosure provide techniques for adjusting the heat absorption rate of an IC to more closely match the heat absorption rates of other ICs of the same module. For example, a highly resistive Si or GaAs layer may be applied to (e.g., coated on) the back of the POG device after substrate thinning, as an IR heat absorption layer. For example, applying a Si/GaAs layer on a backside of a POG device may allow the POG device to reach peak temperature together with Si/GaAs ICs, resolving the non-melting of solder bumps or over-heating of dies.

Figure 6:
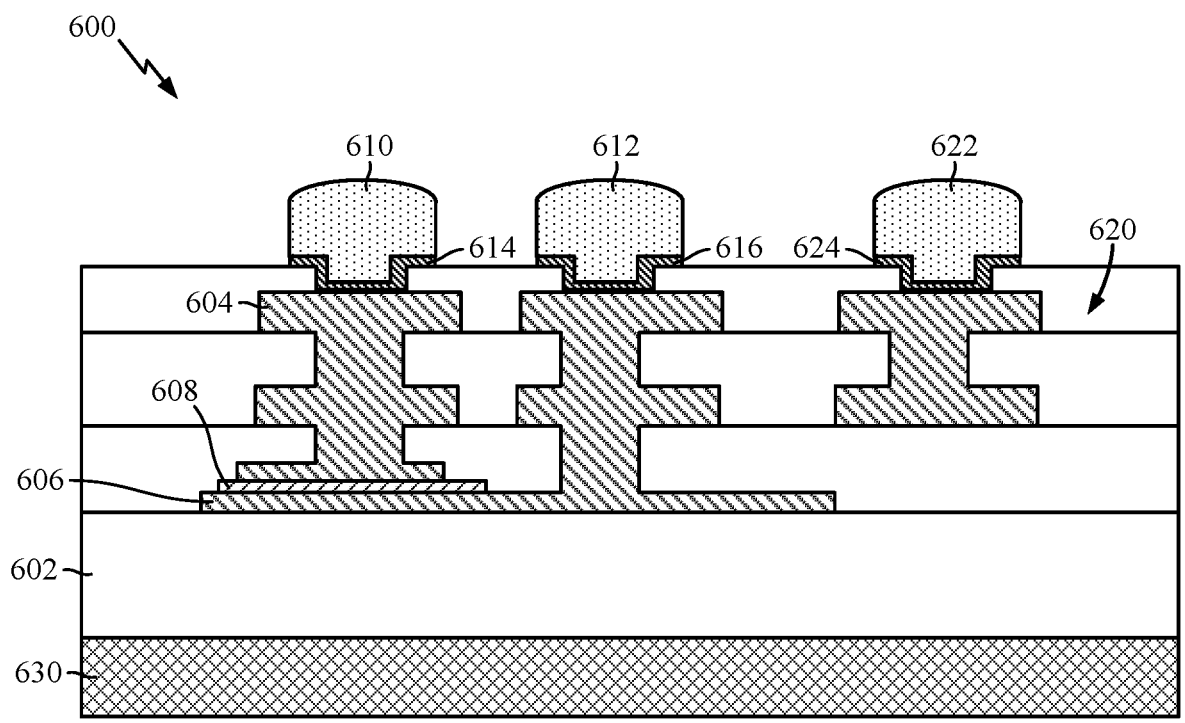
FIG. 6 illustrates an example passive-on-glass (POG) device, in accordance with certain aspects of the present disclosure.

FIG. 6 illustrates a POG device 600, in accordance with certain aspects of the present disclosure. The POG device 600 may correspond to the POG device 414 or 416 described with respect to FIG. 4. The POG device 600 includes a glass substrate 602, above which passive elements are implemented. In certain aspects, the glass substrate 602 may comprise boron difluoride ($BF_2$) or sapphire. For example, a dielectric layer 608 may be disposed between non-insulative regions 604, 606 (e.g., metal regions), to form a capacitive element. Each of the non-insulative regions 604, 606 is coupled to a solder bump 610, 612 through an under bump metallization (UBM) layer 614, 616 to facilitate electrical connection to a module substrate (e.g., substrate 402) as described with respect to FIG. 4.

In certain aspects, the POG device 600 may also include a non-insulative region 620, which may be configured as an inductive element. The non-insulative region 620 may be coupled to a solder bump 622 through a UBM layer 624. In certain aspects, the glass substrate 602 may be a thin layer (e.g., having a thickness of 100-300 micrometers) of glass implemented on a Si or GaAs region 630 (also referred to herein as a "thermal conductivity adjustment region"), allowing the POG device 600 to reach peak temperature together with Si/GaAs ICs during the solder reflow process, as described herein.

Figure 7A:
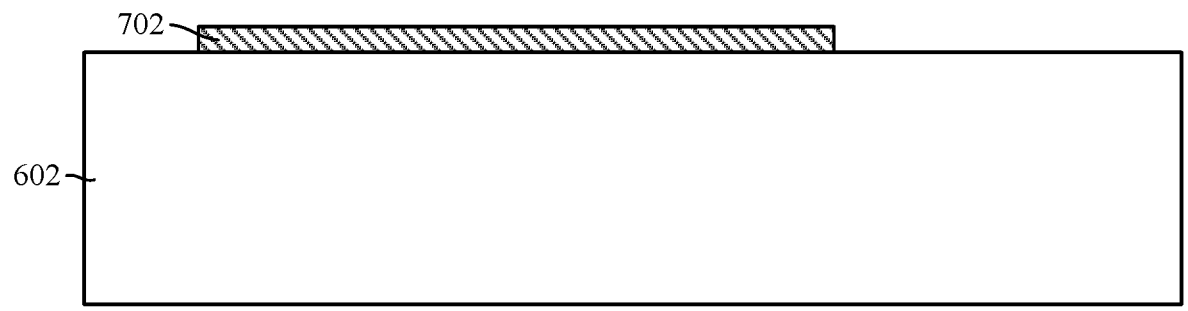
FIGS. 7A-7G illustrate example operations for fabricating a POG device, in accordance with certain aspects of the present disclosure.
Figure 7B:
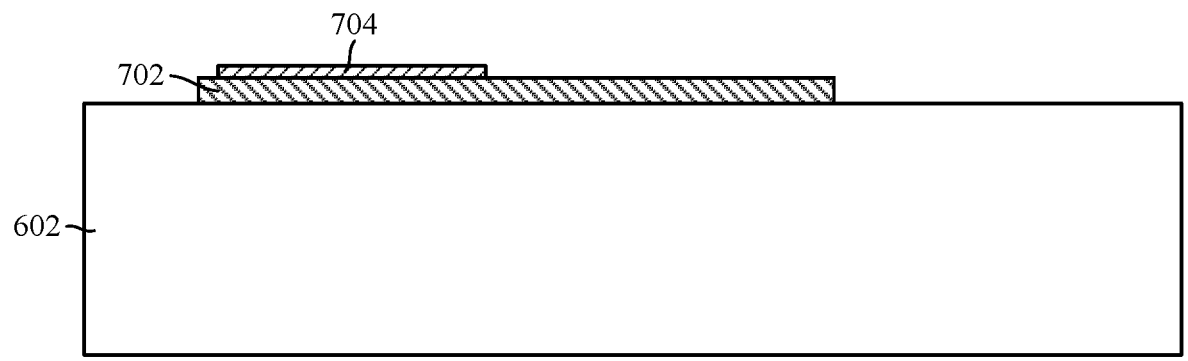
Figure 7C:
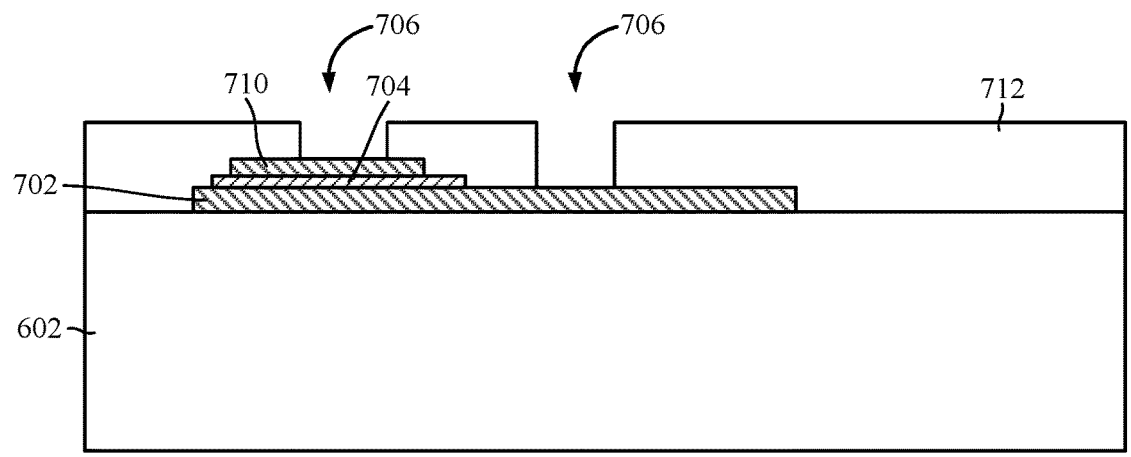
Figure 7D:
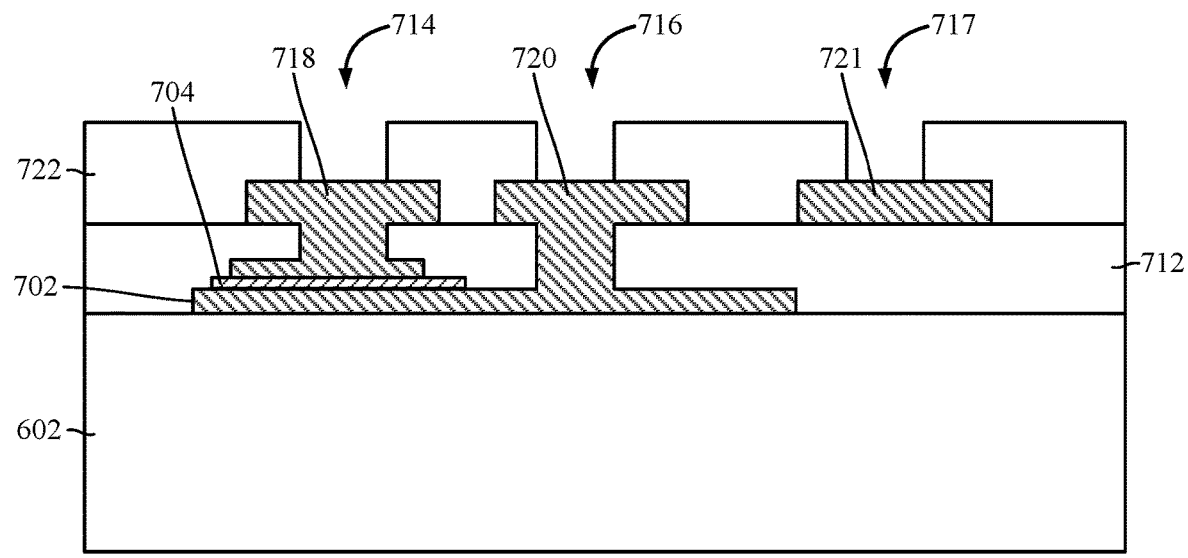
Figure 7E:
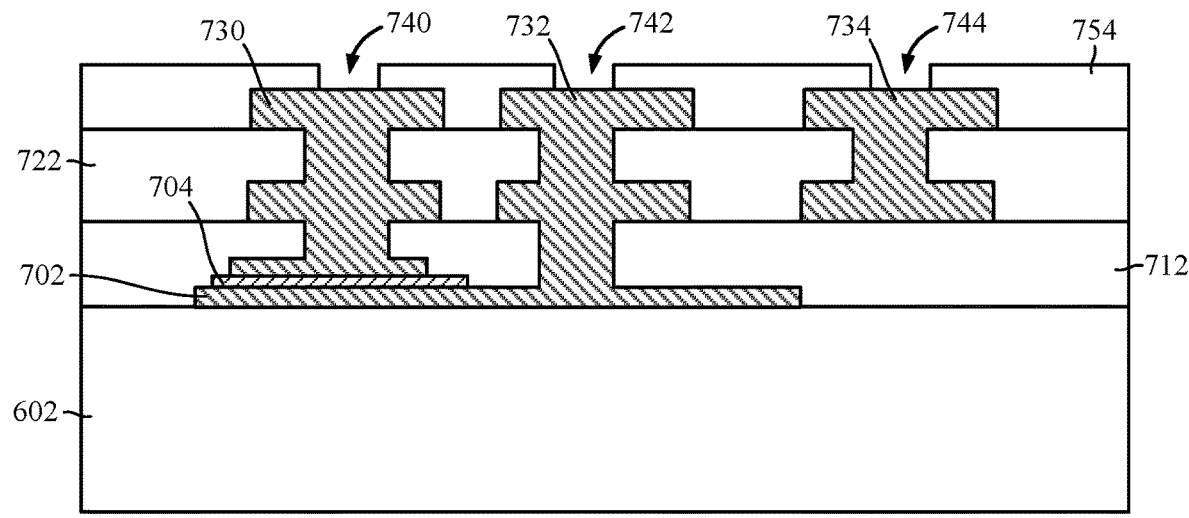
Figure 7F:
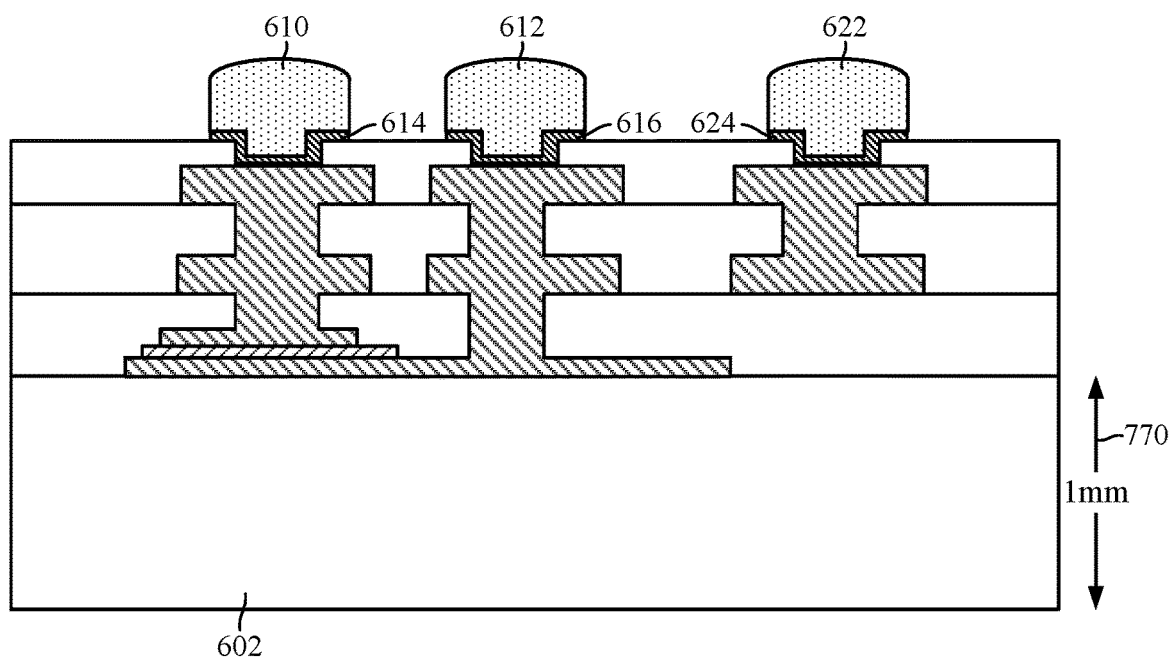

FIGS. 7A-7G illustrate example operations for fabricating the POG device 600, in accordance with certain aspects of the present disclosure. As illustrated in FIG. 7A, a non-insulative layer 702 (e.g., copper (Cu) layer) may be deposited (e.g., plated) above the glass substrate 602, and as illustrated in FIG. 7B, a dielectric layer 704 (e.g., silicon nitride ($Si_3N_4$) layer) may be deposited using chemical vapor deposition (CVD), for example, above the non-insulative layer 702. As illustrated in FIG. 7C, a non-insulative layer 710 may be deposited (e.g., plated) above the dielectric layer 704, followed by application (e.g., coating) of an insulative layer 712 (e.g., polyimide layer) and formation of trenches 706, 708 (e.g., for vias). As illustrated in FIG. 7D, non-insulative regions 718, 720, 721 are deposited (e.g., plated) in the trenches 706, 708 and/or above the insulative layer 712, a dielectric layer 722 (e.g., a polyimide layer) is applied (e.g., coated), and trenches 714, 716, 717 (e.g., for the vias) are formed in the dielectric layer 722. As illustrated in FIG. 7E, non-insulative regions 730, 732, 734 are deposited (e.g., plated), a dielectric layer 754 (e.g., polyimide layer) is applied (e.g., coated), and trenches 740, 742, 744 are formed in the dielectric layer 754. As illustrated in FIG. 7F, the UBM layers 614, 616, 624 may be deposited (e.g., plated), and the solder bumps 610, 612, 622 may be disposed above respective UBM layers 614, 616, 624.

Figure 7G:
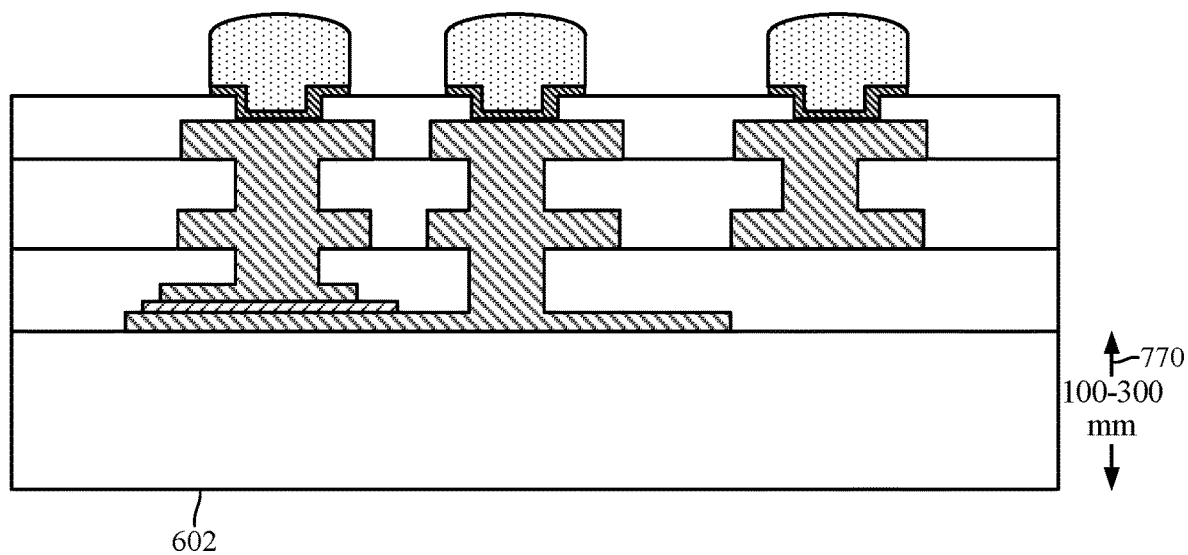

The initial thickness 770 of the glass substrate 602 may be about 1 mm, as illustrated in FIG. 7F. In certain aspects, the thickness of the glass substrate 602 may be reduced, as illustrated in FIG. 7G. For example, the thickness of the glass substrate 602 may be reduced to about 100 to 300 micrometers. After reducing the thickness of the glass substrate 602, the Si or GaAs region 630 may be formed, as illustrated in FIG. 6. The Si or GaAs region 630 may be formed using an amorphous, poly-crystal CVD, or physical vapor deposition (PVD) technique, and may be about 50-100 micrometers in thickness, for example. As described in more detail with respect to FIGS. 8A-8B, in certain aspects, portions of the Si or GaAs region 630 may be disposed in trenches formed in the glass substrate 602 in order to set the thermal absorption (also referred to herein as "thermal conductivity") of the glass substrate 602 as close to Si or GaAs as possible, further reducing thermal mismatch with other ICs of the module 400.

Figure 8A:
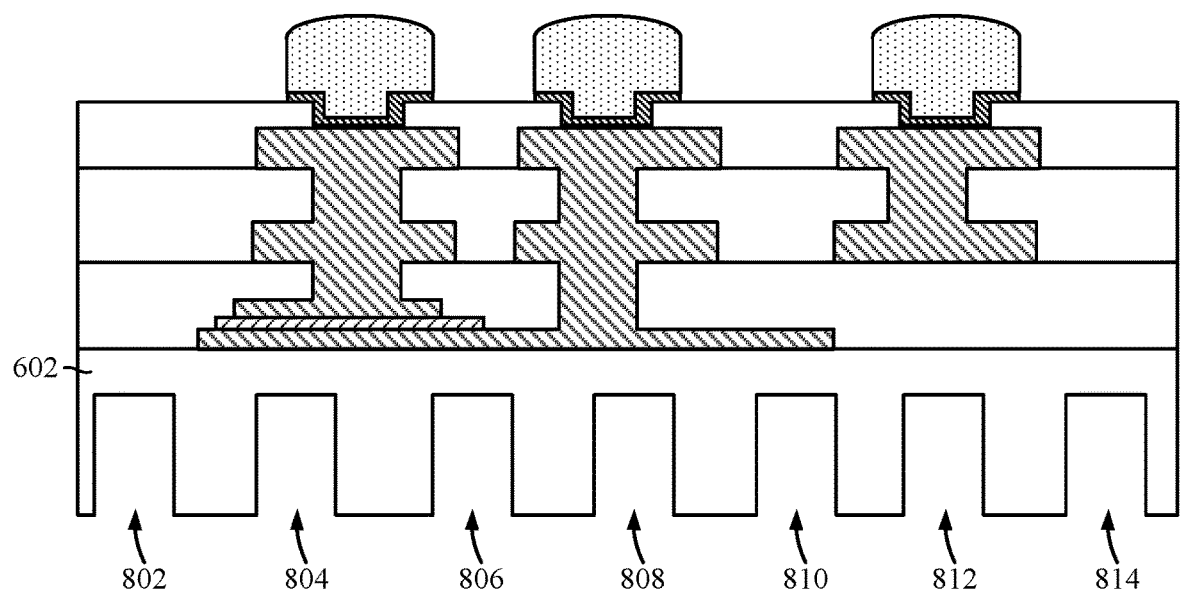
FIGS. 8A-8B illustrate example operations for disposing portions of a thermal conductivity adjustment region in trenches formed in a substrate, in accordance with certain aspects of the present disclosure.
Figure 8B:
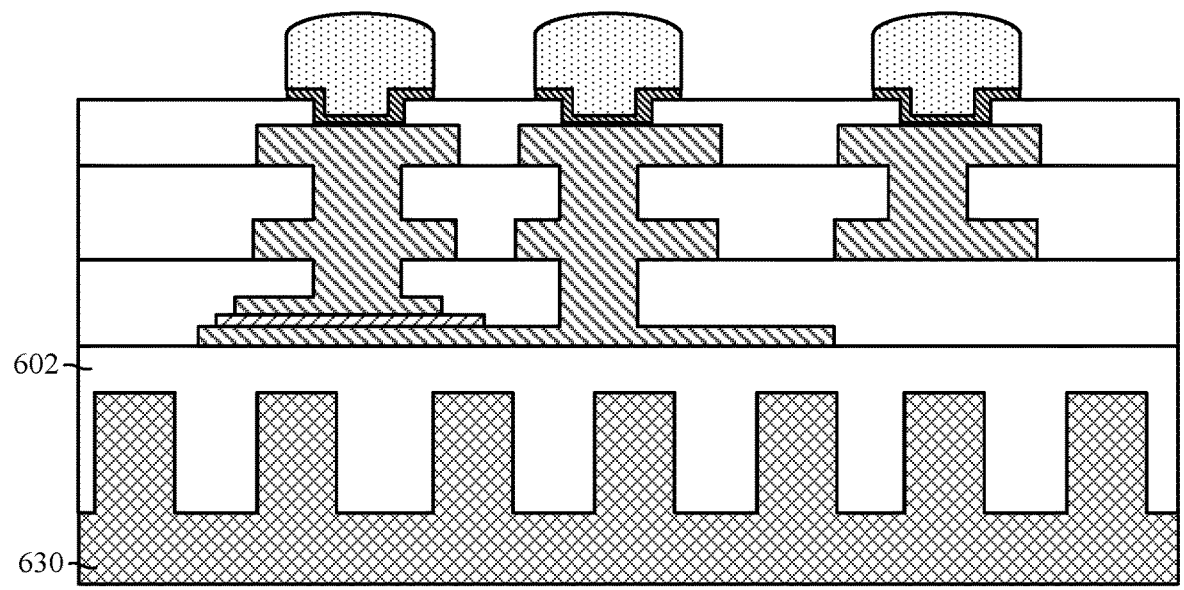

FIGS. 8A-8B illustrate operations for disposing portions of the Si or GaAs region 630 in trenches formed in the glass substrate 602, in accordance with certain aspects of the present disclosure. For example, as illustrated in FIG. 8A, backside trenches 802, 804, 806, 808, 810, 812, 814 may be etched in the glass substrate 602. In certain aspects, the depth of the trenches 802, 804, 806, 808, 810, 812, 814 may be about 50-100 micrometers. As illustrated in FIG. 8B, the Si or GaAs region 630 may be formed on the backside of the POG device after the trenches are etched, such that the Si or GaAs region 630 fills the trenches. In certain aspects, the Si or GaAs region 630 includes multiple layers of GaAs and Si. After the formation of the Si or GaAs region 630, the POG device may be polished to set a total thickness of the POG device in accordance with specifications. While the examples provided herein have described techniques for thermal matching of a POG IC with Si or GaAs ICs to facilitate understanding, the aspects described herein may be applied for thermal matching of ICs comprising other suitable, differing materials.

Figure 9:
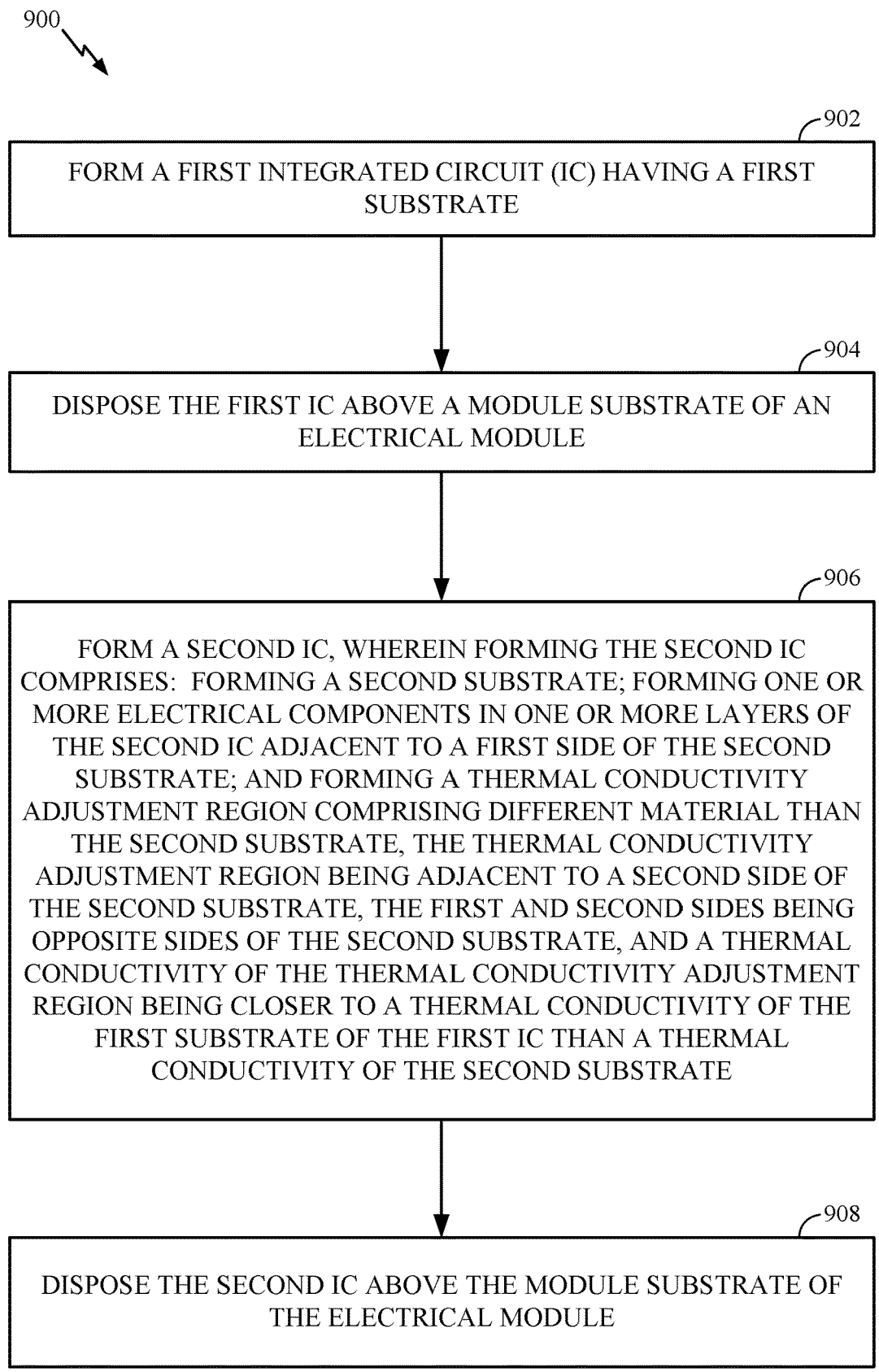
FIG. 9 is a flow diagram illustrating example operations for fabricating an electrical module, in accordance with certain aspects of the present disclosure.

FIG. 9 is a flow diagram illustrating example operations 900 for fabricating an electrical module, in accordance with certain aspects of the present disclosure. The operations 900 may be performed, for example, by a fabrication facility.

Operations 900 may begin, at block 902, with the fabrication facility forming a first IC (e.g., LNA IC 408) having a first substrate (e.g., substrate 420), and at block 904, disposing the first IC above a module substrate (e.g., substrate 402) of the electrical module. At block 906, a second IC (e.g., POG device 414) is formed by the fabrication facility. In certain aspects, forming the second IC involves the fabrication facility forming a second substrate (e.g., glass substrate 602), forming one or more electrical components (e.g., capacitive element and/or inductive element) in one or more layers of the second IC adjacent to a first side of the second substrate, and forming a thermal conductivity adjustment region (e.g., Si or GaAs region 630). The thermal conductivity adjustment region may comprise different material than the second substrate and may be adjacent to a second side of the second substrate, the first and second sides being opposite sides of the second substrate. In certain aspects, a thermal conductivity of the thermal conductivity adjustment region is closer to a thermal conductivity of the first substrate of the first IC than a thermal conductivity of the second substrate. At block 908, the fabrication facility disposes the second IC above the module substrate of the electrical module. In certain aspects, forming the second IC further involves forming one or more trenches (e.g., trenches 802, 804, 806, 808, 810, 812, 814) in the second substrate. In this case, at least a portion of the thermal conductivity adjustment region is formed in the one or more trenches.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. An electrical module, comprising:
   a first substrate;
   a first integrated circuit (IC) disposed above the first substrate and having a second substrate; and
   a second IC disposed above the first substrate, wherein the second IC comprises:
   a third substrate;
   a thermal conductivity adjustment region comprising different material than the third substrate, the thermal conductivity adjustment region being adjacent to a first side of the third substrate; and
   one or more electrical components formed in one or more layers of the second IC adjacent to a second side of the third substrate, wherein the first side and the second side are opposite sides of the third substrate, and wherein a thermal conductivity of the thermal conductivity adjustment region is closer to a thermal conductivity of the second substrate of the first IC than a thermal conductivity of the third substrate.

2. The electrical module of claim 1, wherein the material of the thermal conductivity adjustment region is the same as a material of the second substrate.

3. The electrical module of claim 1, wherein a first wavelength in which the thermal conductivity adjustment region absorbs infrared (IR) energy overlaps with a second wavelength in which the second substrate absorbs IR energy.

4. The electrical module of claim 3, wherein the first wavelength is non-overlapping with a third wavelength in which the third substrate absorbs IR energy.

5. The electrical module of claim 1, wherein the third substrate comprises one or more trenches, at least a portion of the thermal conductivity adjustment region being disposed in the one or more trenches.

6. The electrical module of claim 1, wherein the one or more electrical components comprise passive components.

7. The electrical module of claim 1, wherein the third substrate comprises boron difluoride ($BF_2$) or sapphire.

8. The electrical module of claim 1, wherein the third substrate comprises a glass substrate, the second IC being configured as a passive-on-glass (POG) device.

9. The electrical module of claim 8, wherein the second substrate and the thermal conductivity adjustment region comprise silicon (Si) or gallium arsenide (GaAs).

10. An electrical module, comprising:
    a first substrate;
    a first integrated circuit (IC) disposed above the first substrate and having a second substrate; and
    a second IC disposed above the first substrate, wherein the second IC comprises:
    a third substrate;
    a thermal conductivity adjustment region comprising different material than the third substrate, the thermal conductivity adjustment region being adjacent to a first side of the third substrate; and
    one or more electrical components formed in one or more layers of the second IC adjacent to a second side of the third substrate, wherein the first side and the second side are opposite sides of the third substrate, wherein a first wavelength in which the thermal conductivity adjustment region absorbs infrared (IR) energy overlaps with a second wavelength in which the second substrate absorbs IR energy, and wherein the first wavelength is non-overlapping with a third wavelength in which the third substrate absorbs IR energy.

11. The electrical module of claim 10, wherein the material of the thermal conductivity adjustment region is the same as a material of the second substrate.

12. The electrical module of claim 10, wherein the third substrate comprises one or more trenches, at least a portion of the thermal conductivity adjustment region being disposed in the one or more trenches.

13. The electrical module of claim 10, wherein the one or more electrical components comprise passive components.

14. The electrical module of claim 13, wherein the passive components comprise at least one of a capacitive element or an inductive element.

15. The electrical module of claim 10, wherein the third substrate comprises a glass substrate, the second IC being configured as a passive-on-glass (POG) device.

16. The electrical module of claim 15, wherein the second substrate and the thermal conductivity adjustment region comprise silicon (Si) or gallium arsenide (GaAs).

* * * * *